United States Patent
Matsumoto et al.

(10) Patent No.: US 8,174,045 B2
(45) Date of Patent: May 8, 2012

(54) GLASS FOR COVERING OPTICAL ELEMENT, GLASS-COVERED LIGHT-EMITTING ELEMENT AND GLASS-COVERED LIGHT-EMITTING DEVICE

(75) Inventors: Syuji Matsumoto, Chiyoda-ku (JP); Yasuko Osaki, Chiyoda-ku (JP); Nobuhiro Nakamura, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 224 days.

(21) Appl. No.: 12/621,572

(22) Filed: Nov. 19, 2009

(65) Prior Publication Data
US 2010/0065882 A1 Mar. 18, 2010

Related U.S. Application Data

(63) Continuation of application No. PCT/JP2008/059937, filed on May 29, 2008.

(30) Foreign Application Priority Data

May 30, 2007 (JP) .................. 2007-143639
Jun. 14, 2007 (JP) .................. 2007-157900
Aug. 30, 2007 (JP) .................. 2007-224211

(51) Int. Cl.
*H01L 33/00* (2010.01)
(52) U.S. Cl. ................ 257/100; 257/E33.056
(58) Field of Classification Search ............ 257/40, 257/59, 72, 99, 100, E25.032, E33.056; 313/512, 313/586
See application file for complete search history.

(56) References Cited

U.S. PATENT DOCUMENTS

| | | | | |
|---|---|---|---|---|
| 7,888,870 B2 * | 2/2011 | Hasegawa et al. | ............ | 313/586 |
| 2009/0059591 A1 | 3/2009 | Nakamura et al. | | |
| 2009/0072265 A1 | 3/2009 | Nakamura et al. | | |

FOREIGN PATENT DOCUMENTS

| | | |
|---|---|---|
| JP | 06-183775 | 7/1994 |
| JP | 2001-139344 | 5/2001 |
| JP | 2004-018335 | 1/2004 |
| JP | 2005-011933 | 1/2005 |
| JP | 2005-022962 | 1/2005 |
| WO | 2004-082036 | 9/2004 |

OTHER PUBLICATIONS

U.S. Appl. No. 12/536,538, filed Aug. 6, 2009, Matsumoto et al.
U.S. Appl. No. 12/817,323, filed Jun. 17, 2010, Matsumoto et al.

* cited by examiner

*Primary Examiner* — Quoc Hoang
(74) *Attorney, Agent, or Firm* — Oblon, Spivak, McClelland, Maier & Neustadt, L.L.P.

(57) ABSTRACT

A glass-covered light-emitting element and a glass-covered light-emitting device are provided, which are covered with a glass having a low glass transition point and a thermal expansion coefficient close to that of the light-emitting element.
The glass-covered light-emitting element includes a semiconductor light-emitting element having a principal surface, and a $P_2O_5$—$ZnO$—$SnO$ type glass covering the principal surface of the semiconductor light-emitting element, and the glass consists essentially of, as represented by mol % based on the following oxides, from 20 to 45% of $P_2O_5$, from 20 to 50% of ZnO and from 20 to 40% of SnO, and the glass has a glass transition point of at least 290° C. and at most 450° C., and a thermal expansion coefficient of at most $105 \times 10^{-7}$/° C.

14 Claims, 1 Drawing Sheet

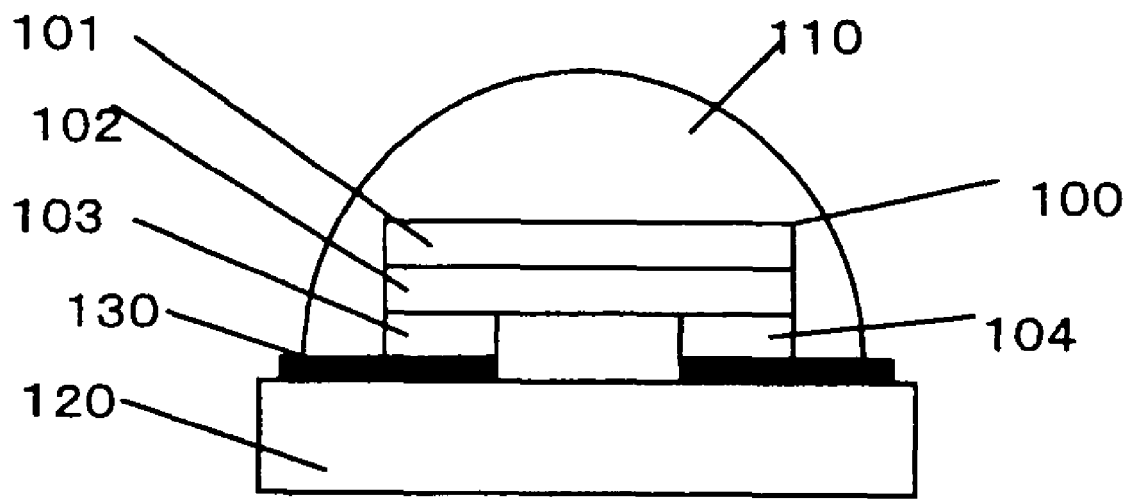

GLASS FOR COVERING OPTICAL ELEMENT, GLASS-COVERED LIGHT-EMITTING ELEMENT AND GLASS-COVERED LIGHT-EMITTING DEVICE

TECHNICAL FIELD

The present invention relates to a glass, particularly to a glass to be employed for covering a semiconductor light-emitting element (light-emitting diode), a glass-covered optical element and a glass-covered light-emitting device covered with the glass.

BACKGROUND ART

In recent years, as a material to cover a light-emitting element, a $TeO_2$ type glass containing $TeO_2$ as the main composition, is proposed. However, the $TeO_2$ type glass employed as the covering material, has a poor transmittance at a wavelength shorter than 400 nm, and is not suitable as a sealing material for a short wavelength (365 to 405 nm) LED (UV-LED).

Here, there is a document (Patent Document 1) which discloses use of a $P_2O_5$—ZnO type glass as the sealing material for a short wavelength LED.

Patent Document 1: WO2004/082036

DISCLOSURE OF THE INVENTION

Problems to be Solved by the Invention

However, Patent Document 1 does not describe the content of the composition of the glass, and there is no disclosure sufficient to carry out the invention. Further, the glass of Patent Document 1 has a thermal expansion coefficient of $11.4 \times 10^{-6}/°C.$, which is far different from the thermal expansion coefficient (about $80 \times 10^{-7}/°C.$) of sapphire that is mainly employed as a substrate for lamination of a light-emitting element (typically GaN), and there is a problem that the glass is not practically usable as a sealing material. Further, the composition of the glass of Patent Document 1 contains substantially no Sn. Accordingly, there is a problem that the glass transition temperature of the glass of Patent Document 1 becomes high.

It is an object of the present invention to provide a glass for covering an optical element which solves the above problems, particularly a glass to be employed for covering a semiconductor light-emitting element (light-emitting diode), and a glass-covered light-emitting element and a glass-covered light-emitting device covered with the glass.

Means for Solving the Problems (1) A glass for covering an optical element, consisting essentially of, as represented by mol % based on the following oxides:
from 27 to 35% of $P_2O_5$,
from 25 to 45% of ZnO,
from 25 to 40% of SnO, and
from 0.1 to 10% of at least one member selected from the group consisting of $B_2O_3$ and CaO, wherein the difference between the peak temperature of crystallization and the glass transition temperature of the glass is at least 150° C.

(2) A glass-covered light-emitting element comprising:
a semiconductor light-emitting element having a principal surface; and
a glass covering the principal surface of the semiconductor light-emitting element and consisting essentially of, as represented by mol % based on the following oxides: from 27 to 35% of $P_2O_5$, from 25 to 45% of ZnO, from 25 to 40% of SnO, and from 0.1 to 10% of at least one member selected from the group consisting of $B_2O_3$ and CaO, wherein the difference between the peak temperature of crystallization and the glass transition temperature of the glass is at least 150° C.

(3) A glass-covered light-emitting element, comprising a semiconductor light-emitting element having a principal surface, and a $P_2O_5$—ZnO—SnO type glass covering the principal surface of the semiconductor light-emitting element.

(4) A glass-covered light-emitting device comprising:
a substrate having a principal surface;
a semiconductor light-emitting element having a principal surface and a rear surface and provided on the principal surface of the substrate so that the rear surface of the semiconductor light-emitting element faces the principal surface of the substrate; and
a glass covering the principal surface of the semiconductor light-emitting element and consisting essentially of, as represented by mol % based on the following oxides: from 27 to 35% of $P_2O_5$, from 25 to 45% of ZnO, from 25 to 40% of SnO, and from 0.1 to 10% of at least one member selected from the group consisting of $B_2O_3$ and CaO, wherein the difference between the peak temperature of crystallization and the glass transition temperature of the glass is at least 150° C.

(5) A glass-covered light-emitting device comprising:
a substrate having a principal surface;
a semiconductor light-emitting element having a principal surface and a rear surface and provided on the principal surface of the substrate so that the rear surface of the semiconductor light-emitting element faces the principal surface of the substrate; and
a $P_2O_5$—ZnO—SnO type glass covering the principal surface of the semiconductor light-emitting element.

Effects of the Invention

The present invention can provide a glass for covering an optical element, which has a thermal expansion coefficient close to that of a light-emitting element and a low glass transition point; and a glass-covered light-emitting element and a glass-covered light-emitting device covered with the glass.

BRIEF DESCRIPTION OF THE DRAWING

FIG. 1 is a cross sectional view of the glass-covered light-emitting device of the present invention.

EXPLANATION OF REFERENCE NUMERALS

100: Light-emitting element
110: Glass
120: Substrate

BEST MODE FOR CARRYING OUT THE INVENTION

Embodiments of the present invention will be described in detail with reference to the attached drawing. In the FIGURE, the corresponding portions are indicated by the corresponding reference numerals. The following embodiments are presented merely as examples, and the present invention can be carried out with various modifications within a range not departing from the concept of the present invention.

First, the glass-covered light-emitting device will be described with reference to the drawing.

FIG. 1 is a cross sectional view of the glass-covered light-emitting device of the present invention. The glass-covered light-emitting device of the present invention has a light-emitting element (such as a light-emitting diode) 100 being a member to be bonded, a glass 110 being a covering material for covering the light-emitting element 100, and a substrate 120 provided with a wiring 130, on which the light-emitting element 100 is mounted.

The light-emitting element 100 has a substrate 101, an LED 102, a positive electrode 103 and a negative electrode 104. The LED 102 is an LED emitting UV light or blue light having a wavelength of from 360 to 480 nm, which is an LED (InGaN type LED) having a quantum well structure using an InGaN layer formed by adding In into GaN as the light-emitting layer. The substrate 101 has a thermal expansion coefficient ($\alpha$) of from $70\times10^{-7}$ to $90\times10^{-7}$/° C. Usually, a sapphire substrate having a thermal expansion coefficient ($\alpha$) of about $80\times10^{-7}$/° C. is employed as the substrate 101.

The substrate 120 is, for example, a rectangular alumina substrate having a purity of from 98.0% to 99.5% and a thickness of from 0.5 mm to 1.2 mm. The substrate 120 is preferably a square alumina substrate having a purity of from 99.0 to 99.5% and a thickness of from 0.7 to 1.0 mm. Here, the wiring 130 formed on a surface of the substrate 120 is a gold wiring produced by a gold paste.

First Embodiment

First, a glass for covering an optical element according to a first embodiment of the present invention will be described.

The glass transition point (Tg) of the glass for covering an optical element according to the first embodiment of the present invention is preferably at least 290° C., more preferably at least 300° C., particularly preferably at least 320° C. Here, if the glass transition point (Tg) is less than 290° C., the content of ZnO is little and/or the content of $P_2O_5$ is large, and the water resistance may be deteriorated. It is preferably at most 400° C., more preferably at most 360° C. If Tg is high, the sealing temperature becomes also high.

The peak temperature of crystallization (Tc) of the glass for covering an optical element according to the first embodiment of the present invention is preferably at least 480° C., more preferably at least 500° C., particularly preferably at least 520° C. Here, if the peak temperature of crystallization (Tc) is less than 480° C., the glass may be crystallized and may not become transparent at a time of sealing.

The difference (Tc−Tg) between the peak temperature of crystallization and the glass transition temperature is preferably at least 150° C., more preferably at least 185° C., particularly preferably at least 200° C. Here, if the difference between the peak temperature of crystallization and the glass transition temperature is less than 150° C., crystallization may occur at the time of sealing. Here, a case where the difference (Tc−Tg) is ∞, that is, a case where no peak of Tc is observed, means a case where no crystallization occurs until a completely mixed liquid phase is formed. Here, the temperature-rising speed at the time of Tc measurement influences on the peak intensity. Here, the temperature-rising speed at the time of Tc measurement is assumed to be from 1 to 10° C./min.

The thermal expansion coefficient ($\alpha$) of the glass for covering an optical element according to the first embodiment of the present invention is at most $105\times10^{-7}$/° C., more preferably at most $95\times10^{-7}$/° C., particularly preferably at most $90\times10^{-7}$/° C. Here, if the thermal expansion coefficient ($\alpha$) is less than $70\times10^{-7}$/° C., the glass transition point increases. It is preferably at least $70\times10^{-7}$/° C., more preferably at least $75\times10^{-7}$/° C., particularly preferably at least $80\times10^{-7}$/° C. Further, if the thermal expansion coefficient ($\alpha$) exceeds $105\times10^{-7}$/° C., in a step of softening the glass to seal a semiconductor light-emitting element and cooling it to room temperature or in subsequent steps, a crack of the glass starting from a portion in contact with the semiconductor light-emitting element may be formed to decrease the light-extraction efficiency or to expose the semiconductor light-emitting element to a moisture in the atmospheric air.

Hereinafter, "mol %" as the unit of the composition of the glass to be employed for a glass-covered light-emitting element and a glass-covered light-emitting device according to the first embodiment of the present invention, is simply referred to as "%" in the explanation.

$P_2O_5$ is a component which stabilizes the glass, and thus, it is essential. If its content is less than 27%, Tg may increase. The content is preferably at least 30%. On the other hand, if the content exceeds 35%, the water resistance of the attached portion may decrease. The content is preferably at most 33%, more preferably at most 31%.

ZnO is a component which stabilizes the glass by e.g. improving the water resistance and decreasing the thermal expansion coefficient, and accordingly, it is essential. If the content is less than 25%, the thermal expansion coefficient becomes so large that it becomes incompatible with the thermal expansion coefficient of the substrate, which may cause a crack. The content is preferably at least 28%, more preferably at least 30%, particularly preferably at least 32%. On the other hand, if the content exceeds 45%, devitrification tends to result, and Tg may become too high. The content is preferably at most 40%, more preferably at most 38%, particularly preferably at most 36%.

SnO has a function of increasing the fluidity, and if the content is less than 25%, the softening point becomes too high and the fluidity may be deteriorated to decrease the strength and the airtightness of the attached portion. The content is preferably at least 28%, more preferably at least 30%, particularly preferably at least 32%. On the other hand, if the content exceeds 40%, vitrification tends to be difficult. The content is preferably at most 38%, more preferably at most 35%.

$B_2O_3$ is not essential, but in order to stabilize the glass, or in order to increase the difference (Tc−Tg), it may be contained up to 5%. If the content exceeds 5%, Tg becomes too high, the refractive index becomes too low and the chemical durability such as water resistance may decrease. The content is preferably at most 4%, more preferably at most 3%, particularly preferably at most 2%. When the glass contains $B_2O_3$, the content is preferably at least 0.1%, particularly preferably at least 0.5%.

CaO is not essential, but in order to improve the water resistance and to decrease the thermal expansion coefficient and to increase the difference (Tc−Tg), CaO is contained up to 10%. If the content exceeds 10%, the glass tends to be unstable, or Tg becomes too high. The content is preferably at most 5%, more preferably at most 3%, particularly preferably at most 2%. When the glass contains CaO, the content is preferably at least 0.1%, particularly preferably at least 0.5%.

$Al_2O_3$ is not essential, but in order to improve the water resistance and to stabilize the glass, $Al_2O_3$ may be contained up to 3%. If the content exceeds 3%, Tg becomes too high, or the viscosity of the molten glass becomes too high to increase the liquid phase temperature. Namely, it becomes difficult to seal a semiconductor optical element. The content is preferably at most 2%, more preferably at most 1%. When the glass contains $Al_2O_3$, the content is preferably at least 0.1%, particularly preferably at least 0.5%.

$In_2O_3$ is not essential, but in order to improve the water resistance and to stabilize the glass, $In_2O_3$ may be contained up to 3%. If the content exceeds 3%, Tg becomes too high, or the viscosity of the molten glass becomes too high to increase the liquid phase temperature. Namely, it becomes difficult to seal a semiconductor optical element. The content is preferably at most 2%, more preferably at most 1%. When the glass contains $In_2O_3$, the content is preferably at least 0.1%, particularly preferably at least 0.5%.

$La_2O_3$ is not essential, but in order to improve the water resistance and to stabilize the glass, it may be contained up to 3%. If the content exceeds 3%, Tg becomes too high, or the viscosity of molten glass becomes too high to increase the liquid phase temperature. Namely, it becomes difficult to seal a semiconductor optical element. The content is preferably at most 2%, more preferably at most 1%. When the glass contains $La_2O_3$, the content is preferably at least 0.1%, particularly preferably at least 0.5%.

At least one type selected from the group consisting of $B_2O_3$ and CaO is a component which increases the difference (Tc−Tg), and is essential. Here, one type or a combination of at least two types of these components are contained in total at least 0.1%, preferably at least 0.5%, particularly preferably at least 1%. Further, if the content exceeds 10%, Tg becomes too high, and accordingly, it is preferably at most 5%.

At least one type selected from the group consisting of $Al_2O_3$, $In_2O_3$ and $La_2O_3$ is not essential, but is a component which stabilizes the glass. Here, the one type or a combination of at least two types of the components are preferably contained in total at least 0.1%, particularly preferably at least 0.5%. Further, if the content exceeds 7%, Tg becomes too high, and accordingly, the content is preferably at most 5%.

The glass employed in the glass-covered optical element or the glass-covered light-emitting device according to the first embodiment of the present invention consists essentially of the above components, but within a range not departing from the object of the present invention, the glass may contain another component such as MgO, SrO, $Bi_2O_3$, $Y_2O_3$, $Gd_2O_3$, $Ce_2O_3$, $CeO_2$, $TiO_2$, $TeO_2$, $SiO_2$, $Ta_2O_5$ or $WO_3$. Here, the glass according to the first embodiment of the present invention preferably contains substantially no PbO.

According to the glass for covering an optical element, a glass-covered optical element and a glass-covered light-emitting device according to the first embodiment of the present invention having the above construction, it is possible to decrease the difference from the light-emitting element in the thermal expansion coefficient, and to maintain the glass transition point at a low level.

Second Embodiment

Now, the glass for covering an optical element according to the second embodiment of the present invention will be described.

The glass transition point (Tg) of the glass for covering an optical element according to the second embodiment of the present invention is preferably at least 290° C., more preferably at least 300° C., particularly preferably at least 320° C. Here, if the glass transition point (Tg) is less than 290° C., the content of ZnO becomes little, and/or the content of $P_2O_5$ becomes large, and accordingly, the water resistance may be deteriorated. Tg is preferably at most 400° C., more preferably at most 360° C. If Tg becomes high, the sealing temperature also becomes high.

The thermal expansion coefficient (α) of the glass for covering an optical element according to the second embodiment of the present invention is at most $105 \times 10^{-7}$/° C., more preferably at most $95 \times 10^{-7}$/° C., particularly preferably at most $90 \times 10^{-7}$/° C. Here, if the thermal expansion coefficient (α) is less than $70 \times 10^{-7}$/° C., the glass transition point increases. The thermal expansion coefficient (α) is preferably at least $75 \times 10^{-7}$/° C. Further, if the thermal expansion coefficient (α) exceeds $105 \times 10^{-7}$/° C., in a step of softening the glass to seal a light-emitting element and cooling the glass to room temperature or in subsequent steps, a crack of the glass starting from portion in contact with the light-emitting element may be formed to decrease the light-extraction efficiency or to expose the light-emitting element to a moisture in the atmospheric air.

The mass reduction ratio in a water resistance test of the glass for covering an optical element according to the second embodiment of the present invention, is preferably at most 50%, more preferably at most 1%, particularly preferably at most 0%. Here, if the mass reduction in its water resistance test of the glass for covering an optical element exceeds 50%, the chemical stability may be deteriorated.

Hereinafter, "mol %" as the unit of the composition of the glass employed in the glass-covered optical element and the glass-covered optical device according to the second embodiment of the present invention is simply referred to as "%" in the explanation.

$P_2O_5$ is a component which stabilizes the glass, and accordingly, it is essential. If the content is less than 20%, vitrification may become difficult. The content is preferably at least 20%, more preferably at least 25%, particularly preferably at least 28%. On the other hand, if the content exceeds 45%, the water resistance of the attached portion may decrease. The content is preferably at most 45%, more preferably at most 37%, particularly preferably at most 35%.

ZnO is a component which stabilizes the glass by e.g. improving the water resistance and decreasing the thermal expansion coefficient, and accordingly, it is essential. If the content is less than 20%, the thermal expansion coefficient becomes so large that it becomes incompatible with the thermal expansion coefficient of the substrate, which may cause a crack. The content is preferably at least 20%, more preferably at least 25%, particularly preferably at least 30%. On the other hand, if the content exceeds 50%, devitrification tends to result, and the softening point may become too high. The content is preferably at most 50%, more preferably at most 45%, particularly preferably at most 42%.

SnO has an effect of increasing fluidity, and if the content is less than 20%, the softening point becomes too high and the fluidity is deteriorated, whereby the strength and the airtightness of the attached portion may decrease. The content is preferably at least 20%, more preferably at least 22%, particularly preferably at least 25%. On the other hand, if the content exceeds 50%, vitrification tends to be difficult. The content is preferably at most 50%, more preferably at most 40%, particularly preferably at most 35%.

The glass employed in the glass-covered optical element and the glass-covered light-emitting device according to the second embodiment of the present invention consists essentially of the above components, but within a rage not departing from the object of the present invention, the glass may contain another component such as MgO, CaO, SrO, BaO, $B_2O_3$, $Al_2O_3$, $Bi_2O_3$, $Y_2O_3$, $La_2O_3$, $Gd_2O_3$, $Ce_2O_3$, $In_2O_3$, $CeO_2$, $TiO_2$, $TeO_2$, $SiO_2$, $Ta_2O_5$ or $WO_3$. Here, the glass according to the second embodiment of the present invention preferably contains substantially no PbO.

According to the glass-covered optical element and the glass-covered light-emitting device according to the second embodiment of the present invention having the above construction, besides the effects of the first embodiment of the present invention, an effect of suppressing crystallization is obtained at the time of sealing.

EXAMPLES

First Embodiment

Example 1

With respect to each of Samples 1 to 18, an orthophosphoric acid aqueous solution (85% $H_3PO_4$) and powders of ZnO and SnO are blended so as to obtain a mixture having the composition shown in mol % in the Tables, and the mixture is dehydrated to obtain 100 g in total of a raw material powder wherein the orthophosphoric acid has been changed to $P_2O_5$. Subsequently, the raw material powder and about 1 g of saccharose are blended, and they are further mixed with about 200 ml of ion-exchanged water in a Teflon container to prepare a slurry. While the slurry is stirred by a stirrer made of Teflon, an orthophosphoric acid aqueous solution is mixed. In this step, since exothermic reaction occurs, it is necessary to pour the orthophosphoric acid aqueous solution carefully and slowly so as to prevent explosive boiling of water. Subsequently, the mixed product was cast in a butt made of stainless steel in which a Teflon sheet was placed, and the mixed product was dried at 200° C. for 3 hours with ventilation, to obtain a cookie-shaped solid product.

The solid product was put in a crucible made of quartz, a cap made of quartz was placed thereon, and the solid product was melted at 1,100° C. for 40 minutes. In this step, the molten product was stirred by a quartz rod a few times to obtain a homogenous molten glass. The homogenous molten glass was cast in a carbon mold to be formed into a plate shape. The plate-shaped glass was immediately put in another electric furnace of 380° C., the temperature was maintained for 1 hour, and the glass was gradually cooled to room temperature in 12 hours.

Here, it is also possible to use a powder raw material of e.g. tin phosphate, calcium phosphate or aluminum phosphate instead of the orthophosphoric acid as the raw material. In such a case, the drying step after blending the powders may be omitted.

Here, Samples 1 to 12 and Samples 15 to 18 are Samples of the present invention and Samples 13 and 14 are Comparative Examples.

With respect to the glass obtained, the glass transition point Tg (unit: ° C.), the peak temperature of crystallization Tc (unit: ° C.), the thermal expansion coefficient (α) (unit: $10^{-7}$/° C.), the sealing temperature (unit: ° C.) and crystallization and devitrification at the time of sealing were measured by the following measurement methods.

Tg: 250 mg of the sample processed into a powder form was put in a platinum pan and Tg was measured by using a differential thermal analyzer Thermo Plus TG8110 (product name) manufactured by Rigaku Corporation, at a temperature-rising speed of 10° C./min.

Tc: By using the above differential thermal analyzer, Tc was measured at the same time of the Tg measurement.

α: The sample was fabricated into a cylindrical shape having a diameter of 5 mm and a length of 20 mm, and by using a thermal expansion meter (horizontal differential detection type thermal expansion meter TD5010 manufactured by Bruker AXS), the thermal expansion was measured at a temperature-rising speed of 10° C./min. Expansion coefficients from 25 to 250° C. were measured at every 25° C., and the average of these values was taken as α.

Sealing temperature: A temperature at which a flow starts and the glass melt becomes (semi)spherical. Tg+155±10° C.

Crystallization at the time of sealing: An example in which the difference (Tc−Tg) is at least 150° C. was designated as ○.

Devitrification: An example in which no crystal precipitation was observed after casting the glass in the carbon mold and before it is solidified, was designated as ○.

Tables 1 to 3 show the results.

TABLE 1

|  | Sample 1 | Sample 2 | Sample 3 | Sample 4 | Sample 5 | Sample 6 | Sample 7 |
|---|---|---|---|---|---|---|---|
| $P_2O_5$ | 30 | 30 | 32 | 33 | 31 | 35 | 30 |
| ZnO | 38 | 38 | 38 | 34.5 | 37.5 | 32 | 38.5 |
| SnO | 30 | 30 | 30 | 30 | 30 | 30 | 30 |
| CaO | 2 |  |  | 0.5 | 0.5 | 0.5 | 0.5 |
| $B_2O_3$ |  | 2 |  | 1.5 | 1 | 2 | 1 |
| $Al_2O_3$ |  |  |  | 0.5 |  | 0.5 |  |
| CaO + $B_2O_3$ | 2 | 2 |  | 2 | 1.5 | 2.5 | 1.5 |
| Tg | 341 | 346 | 330 | 336 | 339 | 334 | 339 |
| Tc | 498 | 514 | 480 | 521 | 501 | 542 | 525 |
| Tc − Tg | 157 | 168 | 150 | 185 | 162 | 208 | 186 |
| α (×$10^{-7}$/° C.) |  |  |  |  | 91.5 | 91.4 |  |
| Sealing temperature | 496 | 501 | 485 | 491 | 494 | 489 | 494 |
| Crystallization at the time of sealing | ○ | ○ | ○ | ○ | ○ | ○ | ○ |
| Devitrification | ○ | ○ | ○ | ○ | ○ | ○ | ○ |

TABLE 2

|  | Sample 8 | Sample 9 | Sample 10 | Sample 11 | Sample 12 | Sample 13 | Sample 14 |
|---|---|---|---|---|---|---|---|
| $P_2O_5$ | 30 | 30 | 30 | 30 | 30 | 30 | 50 |
| ZnO | 38 | 38 | 37.5 | 36.5 | 36 | 38 | 30 |
| SnO | 30 | 30 | 31 | 32 | 32 | 30 | 20 |
| CaO | 1 | 0.5 | 0.5 | 0.5 | 0.5 |  |  |
| $B_2O_3$ | 1 | 1.5 | 1 | 1 | 1 |  |  |
| $Al_2O_3$ |  |  |  |  |  | 0.5 | 2 |

TABLE 2-continued

|  | Sample 8 | Sample 9 | Sample 10 | Sample 11 | Sample 12 | Sample 13 | Sample 14 |
|---|---|---|---|---|---|---|---|
| CaO + B$_2$O$_3$ | 2 | 2 | 1.5 | 1.5 | 1.5 |  |  |
| Tg | 343 | 344 | 346 | 342 | 343 | 346 | 272 |
| Tc | 519 | 526 | 546 | 536 | 547 | 469 |  |
| Tc − Tg | 176 | 182 | 200 | 194 | 204 | 123 |  |
| α (×10$^{-7}$/° C.) |  |  | 88.6 |  | 86 |  | 110 |
| Sealing temperature | 498 | 499 | 501 | 497 | 498 | 501 |  |
| Crystallization at the time of sealing | ○ | ○ | ○ | ○ | ○ | X | X |
| Devitrification | ○ | ○ | ○ | ○ | ○ | X | X |

TABLE 3

|  | Sample 15 | Sample 16 | Sample 17 | Sample 18 |
|---|---|---|---|---|
| P$_2$O$_5$ | 30 | 30 | 30 | 30 |
| ZnO | 36 | 36 | 26 | 44 |
| SnO | 32 | 32 | 40 | 25.5 |
| CaO |  | 1.5 | 2 | 0.5 |
| B$_2$O$_3$ | 1.5 |  | 1.5 |  |
| Al$_2$O$_3$ | 0.5 | 0.5 | 0.5 |  |
| CaO + B$_2$O$_3$ | 1.5 | 1.5 | 3.5 | 0.5 |
| Tg | 352 | 350 | 336 | 360 |
| Tc | 525 | 541 | 549 | 545 |
| Tc − Tg | 173 | 191 | 213 | 185 |
| α(×10$^{-7}$/° C.) | 80.9 | 87.2 | 92.5 | 82.1 |
| Sealing temperature | 507 | 505 | 491 | 515 |
| Crystallization at the time of sealing | ○ | ○ | ○ | ○ |
| Devitrification | ○ | ○ | ○ | ○ |

The glass of Sample 12 was fabricated so as to have a thickness of about 1.5 mm, and its both surfaces were mirror-polished. Thereafter, the glass plate was cut into a glass plate having a thickness of about 1.5 mm and a size of about 3 mm×3 mm.

Meanwhile, an alumina substrate (thickness: 1 mm, size: 14 mm×14 mm) on which a gold wiring pattern was formed, and a LED (model name: E1C60-0B011-03) manufactured by TOYODA GOSEI CO., LTD. on which connecting bumps were formed, were prepared, and the LED was flip-chip mounted on the alumina substrate. Then, in order to inhibit generation of bubbles at the interface with the glass substrate, the alumina substrate on which the LED was mounted was put in an electric furnace (IR heating apparatus), and it was subjected to a heating treatment at 600° C. The temperature-rising speed was set to be 300° C./min, the duration at 600° C. was set to be 2 minutes, and the temperature-falling speed was set to be 300° C./min. Here, the generation of bubbles at the interface between the glass and the substrate is caused by a reaction of the glass with organic contaminants adhering to a surface of the substrate when the glass is softened. Then, since the generated bubbles refract light emitted from a semiconductor light-emitting element, the brightness of the light-emitting device may be lowered or the light distribution of the light-emitting device may be changed. For this reason, before covering the LED with the glass, the substrate on which the LED is mounted is heated to reduce the organic contaminants adhering to the substrate surface to thereby inhibit generation of the bubbles. According to many experiments, the heating temperature is preferably around 600° C. Further, the heating time is preferably around 2 minutes considering the influence of heat on the LED.

On the flip-chip mounted LED, a phosphor-dispersed glass plate was put and they were put in an electric furnace, and the temperature was raised to 490° C. at a speed of 100° C./min, and the temperature was maintained for 2 minutes to soften and flow the glass plate to cover the LED. Thereafter, they were cooled at a speed of 100° C./min.

The glass covering the LED was visually observed, and as a result, no bubble was recognized in the vicinity of the surface.

A DC voltage was applied to the glass-covered optical element thus obtained, and as a result, emission of blue light was confirmed. The light-emission starting voltage was 2.2 to 2.4 V, that was approximately the same as one in a case of bare chip. Further, as shown in Table 4, there was no substantial difference between before and after the sealing in terms of the result of current-voltage measurement. These results indicate that there was no damage to the light-emitting layer of the LED element.

TABLE 4

| Voltage (V) | Electric current before sealing | (mA) after sealing |
|---|---|---|
| 2.3 | 0.005 | 0.005 |
| 2.4 | 0.028 | 0.024 |
| 2.5 | 0.113 | 0.124 |
| 2.6 | 0.453 | 0.412 |
| 2.7 | 1.587 | 1.629 |
| 2.8 | 4.202 | 4.055 |
| 2.9 | 8.355 | 7.984 |
| 3 | 13.038 | 13.12 |

Example 2

In Sample 12, the raw material was prepared by blending the same materials as in Example 1 except that a powder of zinc phosphate was employed instead of the orthophosphoric acid aqueous solution. Further, instead of stirring by a quartz rod, bubbling by an inert gas N$_2$ was carried out. Here, it is a matter of course that Ar may be used as the inert gas instead of N$_2$.

With respect to the glass obtained, analyses of the dehydration effect, Sn valency and the glass transition point Tg (unit: ° C.) were carried out by the following methods. Here, since the method of analysis of the glass transition point Tg is the same as the above-described method, the explanation is omitted.

Sn valency: By using the measurement method of Sn-Mössbauer spectroscopy, the value of Sn-redox was measured. Here, the measurement method of Sn-Mössbauer spectroscopy will be described.

γ ray (23.8 keV) generated according to the energy transition from $^{119m}$Sn to $^{119}$Sn was used as a probe, and by using a transmission method (the γ ray transmitted through a glass sample was measured), the presence ratio (Sn-redox) between divalent Sn and tetravalent Sn in the sample was measured. Specifically, the procedure is as follows.

A γ ray emission port of a radiation source, a glass sample, a Pd filter and a photo-receiving portion of a gas amplification proportional counter (model 45431 manufactured by LND) were disposed on a straight line of from 300 to 800 mm long.

As the radiation source, $^{119m}$Sn of 10 mCi was employed, and the radiation source was moved in the axial direction of the optical system to cause an energy change of γ ray by a Doppler effect. The velocity of the radiation source was adjusted so that it oscillates at a velocity of −10 to +10 mm/sec in the axial direction of the optical system by using a transducer (manufactured by TOYO Research).

As the glass sample, a glass flat plate having a thickness of from 1 to 2 mm was employed.

The Pd filter is an item for improving the counting accuracy of γ ray by the gas amplification proportional counter, and it is a Pd foil having a thickness of 50 μm which removes characteristic X-ray emitted from the glass sample when the glass sample is irradiated with γ ray.

The gas amplification proportional counter is an item for detecting the γ ray received. An electric signal showing the amount of γ ray from the gas amplification proportional counter was amplified by an amplifier (manufactured by Kansai Electronics Co., Ltd.) to detect the received signal. The received signal was linked with the above velocity information by a multichannel analyzer (CMCA550 manufactured by Wissel).

By plotting the data in a graph having a vertical axis representing the detected signal and a lateral axis representing the velocity of the moving radiation source, a spectrum is obtained (Basic and Application of Mossbauer Spectroscopy, pages 45 to 64, by Hirotoshi Sato and Motomi Katada, published by Japan Scientific Societies Press). It took 5 hours to 2 days to accumulate the data to sufficiently lower the signal/noise ratio for the above evaluation.

A peak emerging in the vicinity of 0 mm/sec indicates the presence of tetravalent Sn, and two split peaks emerging in the vicinity of 2.5 mm/sec and 4.5 mm/sec indicate the presence of divalent Sn. The area of each peak was multiplied by a compensation coefficient (Journal of Non-Crystaline Solids 337 (year 2004) pages 232 to 240 "The effect of alumina on the $Sn^{2+}/Sn^{4+}$ redox equilibrium and the incorporation of tin in $Na_2O/Al_2O_3/SiO_2$ melts" authored by Darija Benner and others) (tetravalent Sn: 0.22, divalent Sn: 0.49) and the ratio between these areas was calculated and the percentage of divalent Sn was designated as the Sn-redox value.

Tables 5 and 6 show the evaluation results obtained by the analysis. Table 5 shows the result showing the percentage of divalent Sn based on the total amount of Sn atoms, and Table 6 shows the measurement result of the glass transition point.

TABLE 5

| Drying step/melting | Example 1 | Example 2 |
| --- | --- | --- |
| None (powder raw material) | 96% | More than 99% |
| 500° C. · 3 hrs | 90% | 92% |

TABLE 6

| Drying step/melting | Example 1 | Example 2 |
| --- | --- | --- |
| None (powder raw material) | 345° C. | 346° C. |
| 200° C. · 3 hrs | 343° C. | — |
| 500° C. · 3 hrs | 351° C. | 357° C. |

It is understandable from Table 5 that both in Example 1 and Example 2, the percentage of $Sn^{2+}$ exceeds 90%. Particularly, in the case of Example 2, the percentage of $Sn^{2+}$ exceeded 99%. Namely, little $Sn^{4+}$ was present. $Sn^{4+}$ in the glass has higher effect of strengthening and stabilizing the bone structure of the glass as compared with $Sn^{2+}$. Accordingly, $Sn^{4+}$ increases e.g. the glass transition temperature since $Sn^{4+}$ makes the bone structure more stable as compared with $Sn^{2+}$. The glass transition temperature decreases as the percentage of $Sn^{4+}$ based on the total amount of Sn atoms decreases, in other words, as the percentage of $Sn^{2+}$ increases. Accordingly, as shown in Table 6, the present invention provides an effect of lowering the glass transition point Tg by about 10° C.

Example 3

With respect to each of Samples 19 to 27, an orthophosphoric acid aqueous solution (85% $H_3PO_4$) and powder raw materials of ZnO and SnO were blended so as to obtain a mixture having the composition shown in mol % in the Table, and the mixture is dehydrated to obtain 100 g in total of a raw material powder wherein the orthophosphoric acid becomes $P_2O_5$. Subsequently, the raw material powder and about 1 g of saccharose are mixed, and they are mixed with about 200 ml of an ion-exchanged water in a Teflon container to prepare a slurry. While the slurry is stirred by a stirrer made of Teflon, an orthophosphoric acid aqueous solution is mixed. In this step, since an exothermic reaction occurs, it is necessary to pour the orthophosphoric acid aqueous solution carefully and slowly so as to prevent explosive boiling of water. Subsequently, the mixed product was cast in a butt made of stainless steel on which a Teflon sheet was placed, and the mixed product was dried at 200° C. for 3 hours with ventilation, to obtain a cookie-shaped solid product.

The solid product was put in a crucible made of quartz, a cap made of quartz was placed thereon, and the solid product was melted at 1,100° C. for 40 minutes. In this step, the molten product was stirred a few times by a quartz rod to obtain a homogenous molten glass. The homogenous molten glass was cast in a carbon mold to be formed into a plate shape. The plate-shaped glass was immediately put in another electric furnace of 380° C., the temperature was maintained for 1 hour and the glass was gradually cooled to a room temperature in 12 hours.

Here, Samples 19 to 26 are samples of the present invention and sample 27 is a comparative example.

With respect to the glass obtained, the glass transition point Tg (unit: ° C.) and the thermal expansion coefficient α (unit: $10^{-7}$/° C.) were measured by the following methods.

Tg: 250 mg of a sample processed into a powder form is put in a platinum pan and Tg was measured by Thermo Plus TG8110 (product name) manufactured by Rigaku Corporation.

α: The sample was fabricated into a cylindrical shape having a diameter of 5 mm and a length of 20 mm, and the thermal expansion was measured by using a thermal expansion meter (horizontal differential detection type thermal expansion meter TD5010 manufactured by Bruker AXS) at a temperature-rising speed of 10° C./min. The thermal expansion coefficients within a range of from 25 to 250° C. were obtained at 25° C. interval, and the average of these values was taken as α.

Water resistance test (%): A sample fabricated into a cylindrical shape having a diameter of 5 mm and a length of 20 mm was immersed in warm water of 80° C. for 3 hours, and its weight reduction was measured.

Transmission spectrum: With respect to two plate-shaped samples having a thickness of 1 mm and 5 mm, respectively, and each having a size of 2 cm×2 cm and having both mirror polished surfaces, the transmittance for light having a wavelength of from 300 nm to 800 nm was measured at intervals of 1 nm by using a spectrophotometer U-3500 (product name) manufactured by HITACHI Ltd. The transmittances of the plate-shaped samples of 1 mm and 5 mm thick obtained by the measurement are designated as $T_1$ and $T_5$, respectively, and T@1 mm and T@10 mm (unit: %) are calculated by the following formulas.

$$T@1\ \text{mm} = 100 \times \exp[(1/4) \times \ln(T_5/T_1)]$$

$$T@10\ \text{mm} = 100 \times \exp[10 \times (1/4) \times \ln(T_5/T_1)]$$

Judgment of UV transmission: A sample having a T@1 mm of at least 90% at 365 nm was designated as ○.

Table 7 shows the results.

TABLE 7

|  | Sample 19 | Sample 20 | Sample 21 | Sample 22 | Sample 23 | Sample 24 | Sample 25 | Sample 26 | Sample 27 |
|---|---|---|---|---|---|---|---|---|---|
| $P_2O_5$ | 30 | 30 | 30 | 40 | 40 | 30 | 30 | 35 | 50 |
| ZnO | 20 | 30 | 40 | 40 | 30 | 50 | 35 | 35 | 30 |
| SnO | 50 | 40 | 30 | 20 | 30 | 20 | 35 | 30 | 20 |
| Tg (° C.) | 304 | 323 | 341 | 320 | 296 | 352 | 335 | 332 | 272 |
| α (×10$^{-7}$/° C.) | 100 | 94 | 84 | 85 | 102 | 87 | 90 | 89 | 110 |
| Water resistance test (%) | 0.1 | 0.0 | 0.0 |  | 33.3 | 0.0 |  |  | 100 |
| UV transmission | ○ | ○ | ○ | ○ | ○ | ○ | ○ | ○ | ○ |

The glass of Sample 21 was fabricated into a glass plate having a thickness of 1.5 mm and a size of 3 mm×3 mm, and thereafter, its both surfaces were mirror-polished.

Meanwhile, an alumina substrate (thickness 1 mm, size: 14 mm×14 mm) on which a gold wiring pattern was formed, and a LED (product name: E1C60-0B011-03) manufactured by TOYODA GOSEI CO., LTD. on which connecting bumps were formed, were prepared, and the LED was flip-chip mounted on the alumina substrate. Then, in order to inhibit generation of bubbles at the interface with the glass substrate, the alumina substrate on which the LED was mounted was put in an electric furnace (IR heating apparatus), and was subjected to a heating treatment at 620° C. The temperature-rising speed was set to be 300° C./min, the duration at 620° C. was set to be 2 min, and the temperature-falling speed was set to be 300° C./min. Here, the generation of bubbles at the interface between the glass and the substrate is caused by a reaction of the glass with organic contaminants adhering to the substrate surface when the glass is softened. Then, the generated bubbles refract light emitted from a light-emitting element, whereby the brightness of the light-emitting device may be decreased or the light distribution of the light-emitting device may be changed. For this reason, before covering the LED with the glass, the substrate on which the LED is mounted is heated to reduce the organic contaminants adhering to the substrate surface, to thereby inhibit the generation of bubbles. According to many experiments, the heating temperature is preferably around 600° C. Further, the heating time is preferably around 2 min considering the influence of heat on the LED.

On this flip-chip mounted LED, a phosphor-dispersed glass plate was put and they were put in an electric furnace, and the temperature was raised to 490° C. at a speed of 100° C./min, and the temperature was maintained for 2 min to soften and flow the glass plate to cover the LED. Thereafter, they were cooled at a speed of 100° C./min.

The glass covering the LED was visually observed, and as a result, no bubble was recognized in the vicinity of the surface.

A DC voltage was applied to a glass-covered LED element thus obtained, and as a result, emission of blue light was confirmed. The light-emission starting voltage was from 2.4 to 2.6 V, that was approximately the same as one in a case of bare chip. These results indicate that there was no damage to a light-emitting layer of the LED element.

Here, transmittances of two glasses having different thicknesses were measured, and the reflection-compensated values were calculated to obtain the relation between the transmittance and the thickness, whereby the internal transmittance of a sample having an optional thickness was estimated. As a result, the internal transmittance of the glass of Sample 21 per a thickness of 1 mm for light having a wavelength of 365 nm, is 97%. Further, the internal transmittance of the glass of Sample 21 per a thickness of 10 mm for light having a wavelength of 365 nm, is 74%. Meanwhile, the internal transmittances of a conventional $TeO_2$ type glass for light having a wavelength of 365 nm per a thickness of 1 mm and 10 mm are 77% and 8%, respectively. Thus, according to the glass-covered light emitting element and the glass-covered light-emitting device employing the $P_2O_5$—ZnO—SnO type glass of the present invention, the internal transmittance for light having a short wavelength (365 to 405 nm) is significantly improved as compared with a glass-covered optical element and a glass-covered light-emitting device employing a conventional $TeO_2$ type glass. Accordingly, the glass-covered optical element and the glass-covered light-emitting device employing the $P_2O_5$—ZnO—SnO type glass of the present invention, can be employed as a UV-LED.

The present invention has been described in detail with specific embodiments, but it is evident to a person skilled in the art that various changes or modifications may be made to the present invention so long as they do not depart from the concept and the scope of the present invention.

Industrial Applicability

The glass for covering an optical element of the present invention can be used to seal an LED element employed for backlight light sources for LCD panels, common illuminations or headlamps for automobiles.

The entire disclosures of Japanese Patent Application No. 2007-143639 filed on May 30, 2007, Japanese Patent Application No. 2007-157900 filed on Jun. 14, 2007 and Japanese Patent Application No. 2007-224211 filed on Aug. 30, 2007 including specifications, claims, drawings and summaries are incorporated herein by reference in their entireties.

What is claimed is:

1. A glass for covering an optical element, consisting essentially of as represented by mol % based on the following oxides:
   from 27 to 35% of $P_2O_5$,
   from 25 to 45% of ZnO,
   from 25 to 40% of SnO, and
   from 0.1 to 10% of at least one member selected from the group consisting of $B_2O_3$ and CaO,
   wherein the difference between the peak temperature of crystallization and the glass transition temperature of the glass is at least 150° C.

2. The glass for covering an optical element according to claim 1, wherein the percentage of $Sn^{2+}$ based on the total amount of Sn atoms is at least 90%.

3. The glass for covering an optical element, according to claim 1, which contains, as represented by mol % based on the following oxides:
   from 0 to 3% of $Al_2O_3$,
   from 0 to 3% of $In_2O_3$, and
   from 0 to 3% of $La_2O_3$,
   wherein the content of at least one member selected from the group consisting of $Al_2O_3$, $In_2O_3$ and $La_2O_3$ is from 0.1 to 7%.

4. The glass for covering an optical element according to claim 1, which has an expansion coefficient of from $70 \times 10^{-7}$ to $100 \times 10^{-7}$/° C.

5. The glass for covering an optical element according to claim 1, which has a glass transition temperature of at most 400° C.

6. The glass for covering an optical element according to claim 1, wherein the difference between the peak temperature of crystallization and the glass transition temperature of the glass is at least 180° C.

7. A glass-covered light-emitting element, comprising a semiconductor light-emitting element having a principal surface, and the glass of claim 1 covering the principal surface of the semiconductor light-emitting element.

8. The glass-covered light-emitting element according to claim 7, wherein the glass has a glass transition point of at most 450° C.

9. The glass-covered light-emitting element according to claim 8, wherein the glass consists essentially of, as represented by mol % based on the following oxides:
   from 20 to 45% of $P_2O_5$,
   from 20 to 50% of ZnO, and
   from 20 to 40% of SnO,
   and the glass has a glass transition point of at least 290° C. and a thermal expansion coefficient of at most $105 \times 10^{-7}$/° C.

10. The glass-covered light-emitting element according to claim 9, wherein the content of SnO is from 20 to 35%.

11. The glass-covered light-emitting element according to claim 7, wherein the weight reduction of the glass in its water-resistance test is at most 50%.

12. A glass-covered light-emitting device comprising:
    a substrate having a principal surface;
    a semiconductor light-emitting element having a principal surface and a rear surface and provided on the principal surface of the substrate so that the rear surface of the semiconductor light-emitting element faces the principal surface of the substrate; and
    the glass of claim 1 covering the principal surface of the semiconductor light-emitting element.

13. A glass-covered light-emitting element comprising:
    a semiconductor light-emitting element having a principal surface; and
    a glass covering the principal surface of the semiconductor light-emitting element and consisting essentially of, as represented by mol % based on the following oxides: from 27 to 35% of $P_2O_5$, from 25 to 45% of ZnO, from 25 to 40% of SnO, and from 0.1 to 10% of at least one member selected from the group consisting of $B_2O_3$ and CaO, wherein the difference between the peak temperature of crystallization and the glass transition temperature of the glass is at least 150° C.

14. A glass-covered light-emitting device comprising:
    a substrate having a principal surface;
    a semiconductor light-emitting element having a principal surface and a rear surface and provided on the principal surface of the substrate so that the rear surface of the semiconductor light-emitting element faces the principal surface of the substrate; and
    a glass covering the principal surface of the semiconductor light-emitting element and consisting essentially of, as represented by mol % based on the following oxides: from 27 to 35% of $P_2O_5$, from 25 to 45% of ZnO, from 25 to 40% of SnO, and from 0.1 to 10% of at least one member selected from the group consisting of $B_2O_3$ and CaO, wherein the difference between the peak temperature of crystallization and the glass transition temperature of the glass is at least 150° C.

* * * * *